(12) United States Patent
Ahlgren et al.

(10) Patent No.: US 9,447,491 B2
(45) Date of Patent: Sep. 20, 2016

(54) COATED CUTTING TOOL AND METHOD OF MAKING THE SAME

(71) Applicant: SANDVIK INTELLECTUAL PROPERTY AB, Sandviken (SE)

(72) Inventors: Mats Ahlgren, Taby (SE); Naureen Ghafoor, Linkoping (SE); Magnus Oden, Tullinge (SE); Lina Rogstrom, Linkoping (SE); Mats Johansson Joesaar, Orebro (SE)

(73) Assignee: SANDVIK INTELLECTUAL PROPERTY AB, Sandviken (SE)

( * ) Notice: Subject to any disclaimer, the term of this patent is extended or adjusted under 35 U.S.C. 154(b) by 12 days.

(21) Appl. No.: 14/378,371

(22) PCT Filed: Feb. 14, 2013

(86) PCT No.: PCT/EP2013/000438
§ 371 (c)(1),
(2) Date: Aug. 13, 2014

(87) PCT Pub. No.: WO2013/120614
PCT Pub. Date: Aug. 22, 2013

(65) Prior Publication Data
US 2015/0275348 A1    Oct. 1, 2015

(30) Foreign Application Priority Data

Feb. 14, 2012   (EP) .................................... 12155313

(51) Int. Cl.
*C23C 30/00* (2006.01)
*C23C 14/06* (2006.01)
(Continued)

(52) U.S. Cl.
CPC ........... *C23C 14/0641* (2013.01); *B23C 5/006* (2013.01); *C23C 14/325* (2013.01);
(Continued)

(58) Field of Classification Search
USPC .......... 51/307, 309; 428/216, 336, 325, 697, 428/698, 699; 204/192.15, 192.16
See application file for complete search history.

(56) References Cited

U.S. PATENT DOCUMENTS 5,503,912 A * 4/1996 Setoyama ........... C03C 17/3435
428/212
6,395,379 B1 * 5/2002 Braendle ............. C23C 14/0664
428/699

(Continued)

FOREIGN PATENT DOCUMENTS

EP      603468    *   6/1994
EP     1935999    *   6/2008

(Continued)

OTHER PUBLICATIONS

Dejun "Synthesis of ZrAlN coatings with thermal stability at high temperature" Science in China Series E:Tech Sci 2006 vol. 49 No. 5 p. 576-581.*

(Continued)

*Primary Examiner* — Archene Turner
(74) *Attorney, Agent, or Firm* — Corinne R. Gorski

(57) ABSTRACT

The present invention relates to a coated cutting tool with a coating comprising a multilayer structure consisting of alternating layers A and B forming the sequence A/B/A/B/A ... or alternating layers A and B and an intermediate layer C between the alternating layers A and B forming the sequence A/C/B/C/A/C/B .... Layer A consists of ZrAlN and layer B consists of TiN. Layer C comprises one or more metal elements from each of layers A and B and is of different composition and structure than layers A and B. A method for forming the coated cutting tool is also provided. The method comprises heat treatment of the coated cutting tool prior to use.

34 Claims, 1 Drawing Sheet

(51) Int. Cl.

| | | |
|---|---|---|
| *C23C 28/04* | (2006.01) | |
| *C23C 28/00* | (2006.01) | |
| *C23C 14/32* | (2006.01) | |
| *B23C 5/00* | (2006.01) | |

(52) U.S. Cl.
CPC ........... *C23C28/042* (2013.01); *C23C 28/044* (2013.01); *C23C 28/42* (2013.01); *C23C 30/005* (2013.01); *B23C 2224/00* (2013.01); *B23C 2224/36* (2013.01); *B23C 2228/08* (2013.01); *B23C 2228/10* (2013.01); *Y10T 428/24975* (2015.01)

(56) References Cited

U.S. PATENT DOCUMENTS

| | | | |
|---|---|---|---|
| 6,506,999 B2* | 1/2003 | dos Santos Pereira Ribeiro | ............... C23C 14/0641 428/698 |
| 2007/0111032 A1* | 5/2007 | Nagano | ................. C23C 14/024 428/698 |
| 2007/0284255 A1* | 12/2007 | Gorokhovsky | ....... C23C 14/024 106/286.1 |
| 2009/0226273 A1* | 9/2009 | Johansson | ........... C23C 14/0641 204/192.38 |
| 2012/0090247 A1* | 4/2012 | Miura | ................. C23C 14/0036 51/309 |
| 2012/0114442 A1* | 5/2012 | Johansson | ............... B23B 27/14 204/192.38 |

FOREIGN PATENT DOCUMENTS

| | | |
|---|---|---|
| EP | 2098611 A2 | 9/2009 |
| WO | 2007136777 A2 | 11/2007 |
| WO | 2009/151386 * | 12/2009 |
| WO | 2010114448 A1 | 10/2010 |

OTHER PUBLICATIONS

Lamni et al "Microstructure and nanohardness properties of Zr—Al—N and Zr—Cr—N thin films" J. Vac. Sci. Technol. A 23(4) Jul./Aug. 2005.*

Rogstromr et al: "Age hardening in arc-evaporated ZrAIN thin films",Scripa Materialia, vol. 62, (2010) pp. 739-741.

Franz R et al: "Oxidation behaviour and tribological proerties of arc-evaporated ZrAIN hard coatings",Surface and Coatings Technology, vol. 206, No. 8-9, Jan. 15, 2012 pp. 2337-2345.

Hasegawa et al: Effects of Al contents on microstructures of Cr1-xAlxN and Zr1-xAlxN films synthesized by cathodic arc method.

* cited by examiner

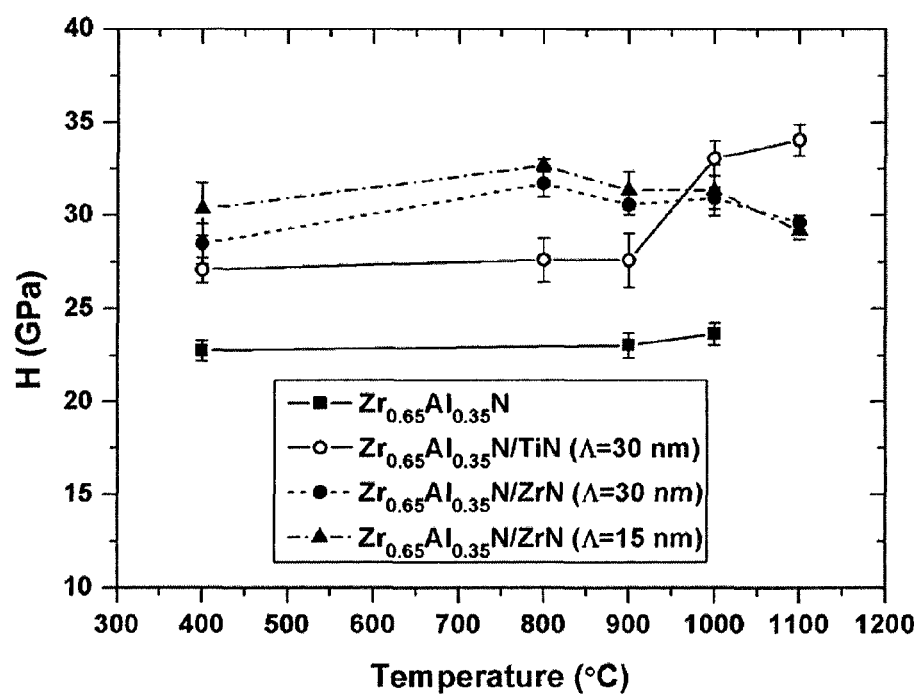

COATED CUTTING TOOL AND METHOD OF MAKING THE SAME

RELATED APPLICATION DATA

This application is a §371 National Stage Application of PCT International Application No. PCT/EP2013/000438 filed Feb. 14, 2013 claiming priority of EP Application No. 12155313.5, filed Feb. 14, 2012.

TECHNICAL FIELD

The present invention relates to coated cutting tools for chip forming machining of metals. In particular, it relates to a coated cutting tool with a coating comprising a multilayer structure, which coated cutting tool has improved performance in cutting operations, in particular in cutting operations generating high temperatures. Furthermore, the present invention relates to a method of manufacturing the coated cutting tool.

BACKGROUND

Cutting tools for chip forming machining of metals, such as round tools, i.e. end mills, drills, etc., and inserts, made of durable materials, such as cemented carbide, cermet, cubic boron nitride or high speed steel, are commonly coated with a surface coating to prolong service life of the cutting tool. It is acknowledged that sufficient hardness of the surface coating is crucial for the wear resistance. The surface coatings are mostly deposited using chemical vapour deposition (CVD) or physical vapour deposition (PVD) techniques.

One of the first wear resistant coatings used was made of titanium nitride (TiN). The high hardness, the high melting point and the oxidation resistance of TiN give a dramatically improved performance and service life as compared to an uncoated cutting tool. These advantageous properties have been further explored and today coatings made of different metal nitrides are used for cutting tools for different applications. By way of example Al is often added to TiN, which gives an improved high temperature oxidation resistance.

It has been realized that the advantageous performance of titanium aluminum nitride (TiAlN) coatings at least partly can be assigned to a miscibility gap in the Ti—Al—N system, which enables stabilization of metastable phases. It has also been discovered that TiAlN coatings exhibit age hardening, i.e. the hardness increases upon heat treatment. The increase in hardness is assigned to the separation of immiscible phases. Cubic TiAlN will decompose upon the heat treatment to cubic TiN and cubic AlN at about 800-900° C., which restrict dislocation motion and gives the age hardening effect. However, at higher temperatures, such as temperatures of about 1000° C., the cubic phase will be followed by a transformation into hexagonal AlN and the coating will dramatically decrease in hardness again which may be detrimental in many applications.

Knutsson et al., *Machining performance and decomposition of TiAlN/TiN multilayer coated metal cutting inserts*, Surface and Coatings Technology 205 (2011) 4005-4010 describes microstructure characterization and cutting tests of coated cutting tool inserts with PVD $Ti_{0.34}Al_{0.66}N$/TiN multilayer coatings. The multilayer coatings were found to have enhanced thermal stability and improved mechanical properties as compared to homogeneous coatings of $Ti_{0.34}Al_{0.66}N$ due to a more pronounced temperature induced age hardening effect and over a broader temperature range, up to about 1050° C. This improvement proved to reduce crater wear and flank wear of the cutting tool inserts as compared to the homogeneous coating. It is also disclosed that the hardness increased with decreasing multilayer period.

Although the above age hardening effect improves the thermal stability and performance of coated cutting tools, the dramatic decrease in hardness at higher temperatures remains a problem, in particular in machining of Ni-based alloys, Ti-based alloys and hardened steel.

SUMMARY

It is an object of the present invention to provide a coated cutting tool with improved performance in cutting operations, in particular in cutting operations generating high temperatures in the coated cutting tool. It is a further object to increase the thermal stability of the coating of a coated cutting tool in order to provide a high hardness of the coating even if subjected to temperatures of 1100° C.

These objects are achieved by a coated cutting tool and method of making the same according to the independent claims.

A coated cutting tool in accordance with the invention comprises a substrate, preferably made of cemented carbide, cermet, ceramic, cubic boron nitride or high speed steel, more preferably cemented carbide or cermet, and a coating on the surface of the substrate. The coating comprises a multilayer structure consisting of:

alternating layers A and B forming the sequence A/B/A/B/A . . . with an individual layer thickness of layer A and layer B of 1-30 nm, where layer A consists of $Zr_{1-x}Al_xN$, where $0<x<1$, and layer B consists of TiN, or alternating layers A and B and an intermediate layer C between the alternating layers A and B forming the sequence A/C/B/C/A/C/B . . . with an individual layer thickness of layer A and layer B of 1-30 nm, whereby layer A consists of $Zr_{1-x}Al_xN$, where $0<x<1$, and layer B consists of TiN, and whereby layer C comprises one or more metal elements from each of layers A and B and is of different composition and structure than layers A and B.

For the purpose of this application a multilayer structure comprises at least 10, more preferably at least 30 individual layers. The multilayer structure exhibits a high hardness even if subjected to temperatures of 1100° C. and thus the performance in cutting operations, in particular cutting operations generating high temperatures in the coated cutting tool, is improved.

In one embodiment of the invention the multilayer structure consists of the alternating layers A of $Zr_{1-x}Al_xN$, where $0<x<1$, and B of TiN forming the sequence A/B/A/B/A . . . . When this multilayer structure is used in a cutting operation heat is generated in the multilayer structure and the microstructure thereof is changed such that the coating exhibits age hardening, i.e. the hardness of the multilayer structure increases upon the heat generation. This age hardening effect is maintained even after heating the multilayer structure up to at least 1100° C. due to the change in microstructure. Upon the heating of the multilayer structure the microstructure is changed such that a separation of ZrN and AlN occurs in the $Zr_{1-x}Al_xN$ layer and forms a layer rich in Zr and Ti at the original interface between the TiN layer and the $Zr_{1-x}Al_xN$ layer and an Al-rich layer in the middle of the original $Zr_{1-x}Al_xN$ layer. Preferably, there is essentially no coherency between sub-layers of the as-deposited multilayer structure, at most occasionally over an interface from one sub-layer to an adjacent sub-layer and not over several interfaces. Thanks to the specific multilayer structure the heating does not introduce columnar grains stretching over several sub-layers, at most some grains coherent across the TiN—$Zr_{1-x}Al_xN$ interface and through the $Zr_{1-x}Al_xN$ layer but at the next $Zr_{1-x}Al_xN$—TiN interface the coherency is interrupted. Thanks to the changed microstructure the hardness is increased and the performance in cutting operations is improved.

In one embodiment of the invention the $Zr_{1-x}Al_xN$ of layer A has a low Al content where x is from 0.02 up to 0.35, preferably x is from 0.10 up to 0.35. With this low Al content layer A comprises cubic $Zr_{1-x}Al_xN$. Preferably layer A consists of cubic $Zr_{1-x}Al_xN$ and layer B consists of cubic TiN. The lattice mismatch between cubic $Zr_{1-x}Al_xN$ and cubic TiN is small and thereby coherence between adjacent alternating layers is enabled and the adhesion between the adjacent alternating layers is improved.

In another embodiment of the invention the $Zr_{1-x}Al_xN$ of layer A has a high Al content where x is from 0.35 up to 0.90, preferably from 0.50 up to 0.90. With this high Al content layer A comprises hexagonal $Zr_{1-x}Al_xN$. With x being larger than 0.90 the advantageous change of the microstructure of the multilayer structure would not be recognized. More preferably the $Zr_{1-x}Al_xN$ of layer A has a high Al content where x is from 0.60 up to 0.90, even more preferably from 0.70 up to 0.90, and the $Zr_{1-x}Al_xN$ is in hexagonal phase. Unlike many other metal nitrides the hexagonal phase of $Zr_{1-x}Al_xN$ has a high hardness and high wear resistance.

In one embodiment of the invention the $Zr_{1-x}Al_xN$ is nanocrystalline with an average grain width of less than 10 nm, preferably less than 5 nm.

In one embodiment of the invention the individual layer thickness of layer A and layer B is larger than 5 nm and smaller than 20 nm. An individual layer thickness larger than 5 nm is desired to obtain the advantageous separation of the two layers into three layers.

In one embodiment of the invention the multilayer structure has a thickness of 1-20, preferably 1-15 μm.

In one embodiment of the invention the coating is a PVD coating.

In another embodiment of the invention the coating is a CVD coating.

In one embodiment of the invention the multilayer structure consists of said alternating layers A and B with an individual layer thickness of 1-30 nm where layer A consists of $Zr_{1-x}Al_xN$, where 0<x<1, and layer B consists of TiN and further an intermediate layer C positioned between said alternating layers A and B comprising one or more metal elements from each of the alternating layers A and B and being of different composition and structure than said alternating layers A and B. Thereby a multilayer structure with layers forming the sequence A/C/B/C/A/C/B . . . is formed. This gives a hardness of the multilayer structure similar to the hardness obtained by the above-mentioned age hardening of the multilayer structure due to use of the cutting tool, i.e. due to generation of heat in the multilayer structure.

In one embodiment of the invention the intermediate layer C has a thickness being between 50 and 150% of the individual layer thickness of layer B.

In one embodiment of the invention the thickness of the intermediate layer C is at least 3 nm.

In one embodiment of the invention the intermediate layer C consists of $Ti_{1-y}Zr_yN$, where y>0, preferably 0<y<1.

In one embodiment of a coated cutting tool in accordance with the above embodiments of the invention the composition of layer A and layer B comprises at least one additional element selected from the first, the second, the third and the fourth additional element in accordance with the following without deteriorating the advantageous hardness properties of the multilayer structure. Layer A comprises first elements comprising Zr and Al and optionally first additional elements selected from one or more of Group 4a, Group 5a and Group 6a elements, Si, and Y and second elements comprising N and optionally second additional elements selected from one or more of C, O and B. Layer B comprises third elements comprising Ti and optionally third additional elements selected from one or more of Group 4a, Group 5a and Group 6a elements, Si, Al and Y, and fourth elements comprising N and optionally fourth additional elements selected from one or more of C, O and B.

The present invention also provides a method for manufacturing a coated cutting tool comprising a substrate, preferably made of cemented carbide, cermet, ceramic, cubic boron nitride or high speed steel, and a coating on the surface of the substrate in accordance with the above embodiments comprising an intermediate layer C. The method comprises the steps of:

depositing a multilayer structure consisting of alternating layers A and B forming the sequence A/B/A/B/A . . . with an individual layer thickness of layer A and layer B of 1-30 nm forming at least part of the coating, layer A consisting of $Zr_{1-x}Al_xN$, where 0<x<1, and layer B consisting of TiN, and heat treating the coating to form an intermediate layer C between said alternating layers A and B so as to form the sequence A/C/B/C/A/C/B . . . , layer C comprising one or more metal elements from each of said alternating layers A and B.

Preferably, the properties of the as-deposited multilayer structure of the method are in accordance with above-mentioned embodiments.

In one embodiment the coating is heat treated at at least 1000° C., preferably at least 1100° C. in non-oxidizing atmosphere to form the intermediate layer C.

The coating may be deposited by CVD or PVD.

In one embodiment of the invention the multilayer structure is deposited by PVD, such as sputter deposition, cathodic arc deposition, evaporation or ion plating.

A multilayer structure consisting of alternating layers A, B and C forming the sequence A/C/B/C/A/C/B . . . may also be accomplished by depositing these layers in sequence.

Other objects, advantages and novel features of the invention will become apparent from the following detailed description of the invention when considered in conjunction with the accompanying drawings and claims.

BRIEF DESCRIPTION OF DRAWINGS

Embodiments of the invention will now be described with reference to the accompanying drawings, wherein:

FIG. 1 shows the hardness of a coating in accordance with the invention as function of annealing temperature and compared to reference coatings.

DETAILED DESCRIPTION

A coated cutting tool in accordance with a first embodiment of the invention comprises a substrate and a PVD coating on the substrate. The coating comprises a multilayer structure with a thickness of 1-20, preferably 1-15 μm consisting of alternating layers A and B forming the sequence A/B/A/B/A . . . with an individual layer thickness of 1-30 nm, preferably larger than 5 nm and smaller than 20 nm, where layer A consists of cubic $Zr_{1-x}Al_xN$, where x is from 0.02 up to 0.35, preferably x is from 0.10 up to 0.35, and layer B consists of cubic TiN. Preferably, the $Zr_{1-x}Al_xN$ is nanocrystalline with an average grain width of less than 10 nm, preferably less than 5 nm.

A coated cutting tool in accordance with a second embodiment of the invention is formed from a substrate and a coating in accordance with the first embodiment and heat treated at at least 1000° C., preferably at least 1100° C. in non-oxidizing atmosphere to change the microstructure of the multilayer structure of the coating. After the heat treatment the multilayer structure consists of alternating layers A and B and an intermediate layer C positioned between layer A and layer B forming the sequence A/C/B/C/A/C/B/C/A . . . , each layer with an individual layer thickness of 1-30 nm. Layer A consists of cubic $Zr_{1-x}Al_xN$, where x is from 0.02 up to 0.35, preferably x is from 0.10 up to 0.35, and layer B consists of cubic TiN. Preferably, the $Zr_{1-x}Al_xN$ is nanocrystalline with an average grain width of less than 10 nm, preferably less than 5 nm. Layer C comprises one or more metal elements from each of the alternating layers A and B and is of different composition and structure than said alternating layers A and B. Due to separation of ZrN and AlN during the heat treatment in the $Zr_{1-x}Al_xN$ layer the layer C, which is rich in Zr and Ti forms at the original interface between the TiN layer and the $Zr_{1-x}Al_xN$ layer and an Al-rich zone is formed in the middle of the original ZrAlN layer. For example, the intermediate layer C may consist of $Ti_{1-y}Zr_yN$, where y>0, preferably 0<y<1. The preferred thickness of layer C is dependent on the heat treatment and the as-deposited individual layer thicknesses. The formation of layer C takes place at the expense of layer A. Preferably the thickness of layer C is at least 3 nm, however layer C preferably has a thickness being between 50 and 150% of the individual layer thickness of layer B and layer A preferably has a thickness of at least 3 nm after heat treatment. Preferably, there are no columnar grains stretching over several sub-layers, at most some grains coherent across TiN—ZrAlN interface and through the $Zr_{1-x}AlN$ layer but at next interface coherency is interrupted.

A coated cutting tool in accordance with a third embodiment of the invention comprises a substrate and a PVD coating on the substrate. The coating comprises a multilayer structure with a thickness of 1-20, preferably 1-15 μm consisting of alternating layers A and B forming the sequence A/B/A/B/A . . . with an individual layer thickness of 1-30 nm, preferably larger than 5 nm and smaller than 20 nm, where layer A consist of $Zr_{1-x}Al_xN$, where x is from 0.35 up to 0.90, preferably x is from 0.70 up to 0.90, and layer B consists of cubic TiN. The $Zr_{1-x}Al_xN$ of layer A comprises hexagonal phase of $Zr_{1-x}Al_xN$. Preferably, the $Zr_{1-x}Al_xN$ is nanocrystalline with an average grain width of less than 10 nm, preferably less than 5 nm.

A coated cutting tool in accordance with a fourth embodiment of the invention is formed from a substrate and a coating in accordance with the third embodiment and heat treated at at least 1000° C., preferably at least 1100° C. in non-oxidizing atmosphere to change the microstructure of the multilayer structure of the coating. After the heat treatment the multilayer structure consists of alternating layers A and B and an intermediate layer C positioned between layer A and layer B forming the sequence A/C/B/C/A/C/B/C/A . . . , each layer with an individual layer thickness of 1-30 nm. Layer A consists of hexagonal $Zr_{1-x}Al_xN$, where x is from 0.35 up to 0.90, preferably x is from 0.70 up to 0.90, and layer B consists of cubic TiN. Preferably, the $Zr_{1-x}Al_xN$ is nanocrystalline with an average grain width of less than 10 nm, preferably less than 5 nm. Layer C comprises one or more metal elements from each of the alternating layers A and B and is of different composition and structure than said alternating layers A and B. Due to separation of ZrN and AlN during the heat treatment in the $Zr_{1-x}Al_xN$ layer the layer C, which is rich in Zr and Ti forms at the original interface between the TiN layer and the $Zr_{1-x}Al_xN$ layer and an Al-rich zone is formed in the middle of the original ZrAlN layer. For example, the intermediate layer C may consist of $Ti_{1-y}Zr_yN$, where y>0, preferably 0<y<1. The preferred thickness of layer C is dependent on the heat treatment and the as-deposited individual layer thicknesses. The formation of layer C takes place at the expense of layer A. Preferably the thickness of layer C is at least 3 nm, however layer C preferably has a thickness being between 50 and 150% of the individual layer thickness of layer B and layer A preferably has a thickness of at least 3 nm after heat treatment. Preferably, there are no columnar grains stretching over several sub-layers, at most some grains coherent across TiN—ZrAlN interface and through the $Zr_{1-x}Al_xN$ layer but at next interface coherency is interrupted.

Example 1

Invention—$Zr_{0.65}A_{0.35}N/TiN$ Λ=15 nm

A coating consisting of alternating layers of $Zr_{0.65}Al_{0.35}N$ and TiN was deposited by cathodic arc deposition on a polished CNMG 120408-MM substrate made of WC-Co 10 wt-% Co cemented carbide using an Oerlikon Balzers RCS system to form coated cutting tools. A $Zr_{0.65}Al_{0.35}$ target and a Ti target serving as cathodes were placed at opposite sides of the vacuum chamber of the system. Substrates were loaded in the vacuum chamber and deposition was performed at 400° C. in a flow of $N_2$ (400 sccm) and Ar (200 sccm), at a pressure of 1.7 Pa, with a substrate bias of −40 V while rotating the substrates at 5 rpm to alternately be exposed to said targets resulting in multilayer structures consisting of alternating layers of $Zr_{1-x}Al_xN$ and TiN with a period of Λ=15 nm, i.e. an individual layer thickness of 7.5 nm, as determined by cross-sectional TEM. The coating thickness was 2.2 μm on the flank side. The relative composition of Zr and Al in the deposited coating is essentially the same as in the target. After deposition, the coated cutting tools were annealed in an Ar atmosphere for 2 hours at constant temperatures between 800 and 1100° C.

Example 2

Invention—$Zr_{0.65}Al_{0.35}N/TiN$ Λ=30 nm

A coating consisting of alternating layers of $Zr_{0.65}Al_{0.35}N$ and TiN was deposited by cathodic arc deposition and annealed as described in Example 1 but with a substrate rotation of 2.5 rpm resulting in a period of Λ=30 nm, i.e. an individual layer thickness of 15 nm. The coating thickness was 2.6 μm on the flank side.

Example 3

Reference—$Zr_{0.65}Al_{0.35}N/ZrN$ Λ=15 nm

A coating consisting of alternating layers of $Zr_{0.65}Al_{0.35}N$ and ZrN with a period of Λ=15 nm was deposited by cathodic arc deposition and annealed as described in Example 1 but with a Zr target instead of a Ti target. The coating thickness was about 2-3 μm.

Example 4

Reference—$Zr_{0.65}Al_{0.35}N/ZrN$ Λ=30 nm

A coating consisting of alternating layers of $Zr_{0.65}Al_{0.35}N$ and ZrN with a period of Λ=30 nm was deposited by cathodic arc deposition and annealed as described in Example 2 but with a Zr target instead of a Ti target. The deposition time was the same as in Example 2 and hence the coating thickness was about the same.

Example 5

Reference—$Zr_{0.65}Al_{0.35}N$ single-layer

A coating consisting of a single-layer of $Zr_{0.65}Al_{0.35}N$ was deposited by cathodic arc deposition as described in Example 1 but using only a $Zr_{0.65}Al_{0.35}$ target and without rotation. The deposition time was the same as in Example 2 and hence the and hence coating thickness was about the same.

Microstructure and Mechanical Properties of Coatings of Examples 1-4

The microstructure and the mechanical properties of the as-deposited and annealed films of Examples 1-5 were investigated.

The structure of as-deposited and annealed films was studied by x-ray diffraction using a PANalytical Empyrean diffractometer.

Mechanically polished and ion-milled cross sectional samples were studied by (scanning) transmission electron microscopy ((S)TEM) in bright field mode, high resolution mode and selected area electron (SAED) patterning using a FEI Technai G2 transmission. Energy dispersive x-ray spectroscopy (EDS) analysis was performed in STEM mode.

The mechanical properties were characterized by nanoindentation using a UMIS 2000 system equipped with a Berkovich indenter. Polished, tapered (about 5°) cross sections of the films were prepared and a minimum of 20 indents were made in each sample using a load of 40 mN. The data was analyzed by the method of Oliver and Pharr (W. C. Oliver, G. M. Pharr, J. Mater. Res. 7 (1992) 1564) and the mean value and standard deviation from the 20 measurements was determined.

FIG. 1 shows the hardness as a function of annealing temperature of the multilayered coatings of Examples 2, 3 and 4 and the single-layer coating of Example 5. The hardness of the as-deposited single-layer $Zr_{0.65}Al_{0.35}N$ coating of Example 5 is 23 GPa and is stable up to annealing temperatures of 1000° C. For the as-deposited multilayered coatings, the highest hardness, 30 GPa, is found for the coating with the shortest period. Annealing of both the $Zr_{0.65}Al_{0.35}N/ZrN$ coatings at 800° C. causes the hardness to increase, but after annealing at higher temperatures the hardness is lower again. The hardness of the $Zr_{0.65}Al_{0.35}N/TiN$ (Λ=30 nm) coating is stable up to annealing temperatures of 900° C. At higher annealing temperatures the hardness increases and after annealing at 1100° C. the hardness of the $Zr_{0.65}Al_{0.35}N/TiN$ (Λ=30 nm) coating is 34 GPa. Thus the hardening effect is much higher in the multilayered coating comprising the TiN sub-layer and no decrease is seen at such high temperature as 1100° C.

X-ray diffractograms of the as-deposited multilayered $Zr_{0.65}Al_{0.35}N/ZrN$ coatings showed broad and asymmetric peaks from cubic ZrN. X-ray diffractograms of the annealed multilayered $Zr_{0.65}Al_{0.35}N/ZrN$ coatings showed narrower peaks that were shifted to higher angles. Any peaks from cubic ZrAlN in the multilayered $Zr_{0.65}Al_{0.35}N/ZrN$ coatings overlap with the peaks from the cubic ZrN.

TEM studies showed that a separation of ZrN and AlN had occurred in the $Zr_{1-x}Al_xN$ layer giving an Al rich layer in the middle of the $Zr_{1-x}Al_xN$ layer and Zr-rich layers at the original $Zr_{1-x}Al_xN$—ZrN interfaces. The multilayered $Zr_{0.65}Al_{0.35}N/ZrN$ coating is at least partly coherent across the Al- and Zr-rich layers and large cubic grains have developed that continues over several sub-layers. The TEM studies further showed that no hexagonal phases were present in the annealed multilayered $Zr_{0.65}Al_{0.35}N/ZrN$ coatings and further that a separation of ZrN and AlN had occurred.

The as-deposited multilayered $Zr_{0.65}Al_{0.35}N/TiN$ coating showed diffraction peaks from both cubic TiN and cubic ZrAlN. The peaks from the c-ZrAlN phase were broad. After annealing at 800° C., the diffraction peaks from both phases were narrowed and the peaks from cubic TiN were shifted to higher angles. Annealing at 1000° C. caused the diffraction peaks of the cubic ZrAlN phase to move to higher angles, while no change is observed for the cubic TiN peaks.

TEM studies showed that the TiN grain size of the as-deposited multilayered $Zr_{0.65}Al_{0.35}N/TiN$ coating was determined by the TiN layer thickness and the TiN grains did not continue across the sharp interface to the nanocrystalline $Zr_{1-x}Al_xN$ layers having a $Zr_{1-x}Al_xN$ grain width of about 5 nm. In a few places the cubic lattice was coherent across the TiN—$Zr_{1-x}Al_xN$ interface. SAED confirmed the presence of cubic TiN and a cubic phase with a lattice spacing close to cubic ZrN.

Annealing of the multilayered $Zr_{0.65}Al_{0.35}N/TiN$ coating at 1100° C. made the TiN grains appear more clear in the TEM image, made the TiN—ZrAlN interfaces more diffuse and the structure within the ZrAlN layers changed to a Zr-rich layer at the original interface between the sub-layers and an Al-rich layer in the middle of the original $Zr_{1-x}Al_xN$ layer. In contrast to the annealed multilayered $Zr_{0.65}Al_{0.35}N/ZrN$ coatings there were no columnar grains stretching over several sub-layers, at most some grains coherent across TiN—$Zr_{1-x}Al_xN$ interface and through the $Zr_{1-x}Al_xN$ layer but at next interface coherency interrupted. At the original interface between the sublayers a layer rich in Ti and Zr was formed. SAED showed that two cubic phases, c-TiN and c-ZrN, no hexagonal phase, were present in the annealed coating.

Example 6

Invention—$Zr_{0.65}Al_{0.35}N/TiN$

A coating consisting of alternating layers of $Zr_{0.65}Al_{0.35}N$ and TiN was deposited on a CNMG 120408-MM substrate made of WC-Co 10 wt-% Co cemented carbide by cathodic arc deposition as described in Example 1 but with a threefold substrate rotation. The coating thickness was 2.2 μm on the flank side and 1.7 μm on the rake side, as determined by cross-sectional light optical microscopy.

Example 7

Invention—$Zr_{0.65}Al_{0.35}N/TiN$

A coating consisting of alternating layers of $Zr_{0.65}Al_{0.35}N$ and TiN was deposited on a CNMG 120408-MM substrate made of WC-Co 10 wt-% Co cemented carbide by cathodic arc deposition as described in Example 2 but with a three-fold substrate rotation. The coating thickness was 2.6 μm on the flank side and 1.9 μm on the rake side.

Example 8

Invention—$Zr_{0.50}Al_{0.50}N/TiN$

A coating consisting of alternating layers of $Zr_{0.50}Al_{0.50}N$ and TiN was deposited as described in Example 7 but with a $Zr_{0.50}Al_{0.50}$ target instead of a $Zr_{0.65}Al_{0.35}$ target. The coating thickness was 1.5 μm on the flank side and 1.0 μm on the rake side.

Example 9

Invention—$Zr_{0.17}Al_{0.83}N/TiN$

A coating consisting of alternating layers of $Zr_{0.17}Al_{0.83}N$ and TiN was deposited as described in Example 7 but with a $Zr_{0.17}Al_{0.83}$ target instead of a $Zr_{0.65}Al_{0.35}$ target. The coating thickness was 1.7 μm on the flank side and 0.9 μm on the rake side.

Example 10

Reference—$Ti_{33}Al_{77}N$

A single-layer coating consisting of $Ti_{33}Al_{77}N$ was deposited as described in Example 6 using only a $Ti_{33}Al_{77}$ target at a pressure of 10 μbar and −100 V substrate bias. The coating thickness was 4.79 μm on the flank side and 3.2 μm on the rake side.

Example 11

Testing

The coated cutting tools of Examples 6-10 were evaluated with respect to crater wear in a continual longitudinal turning operation in ball bearing steel (Ovako 825B) with depth of cut 2 mm, cutting speed 160 m/min, feed speed 0.3 mm/rev and using coolant. The stop criteria was crater area of 0.8 $mm^2$ and cutting times required to reach this criteria are indicated in Table 1.

TABLE 1

| Coated cutting tool | Cutting time (min) |
| --- | --- |
| Example 6 | 13 |
| Example 7 | 12 |
| Example 8 | 9 |
| Example 9 | 10 |
| Example 10 | 6 |

While the invention has been described in connection with various exemplary embodiments, it is to be understood that the invention is not to be limited to the disclosed exemplary embodiments, on the contrary, it is intended to cover various modifications and equivalent arrangements within the appended claims.

The invention claimed is:

1. A coated cutting tool comprising a substrate and a coating on the substrate, wherein said coating comprises a multilayer structure, whereby said multilayer structure comprises:

alternating layers A and B forming the sequence A/B/A/B/A . . . with an individual layer thickness of layer A and layer B of 1-30 nm, whereby layer A consists of Zr1−xAlxN, where 0<x<1, and layer B consists of TiN; and in an area being used in a cutting operation the multilayer structure consists of alternating layers A and B and an intermediate layer C between said alternating layers A and B forming the sequence A/C/B/C/A/C/B . . . with an individual layer thickness of layer A and layer B of 1-30 nm, whereby layer A consists of Zr1−xAlxN, where 0<x<1, and layer B consists of TiN and whereby layer C comprises one or more metal elements from each of layers A and B and is of different composition and structure than layers A and B.

2. The coated cutting tool of claim 1, wherein x is from 0.02 up to 0.35.

3. The coated cutting tool of claim 2, wherein x is from 0.10 up to 0.35.

4. The coated cutting tool of claim 1, wherein the Zr1−xAlxN is cubic.

5. The coated cutting tool of claim 1, wherein x is from 0.35 up to 0.90.

6. The coated cutting tool of claim 5, wherein x is from 0.70 up to 0.90.

7. The coated cutting tool of claim 5, wherein layer A comprises a hexagonal phase of Zr1−xAlxN.

8. The coated cutting tool of claim 1, wherein the Zr1−xAlxN is nanocrystalline with an average grain width of less than 10 nm.

9. The coated cutting tool of claim 1, wherein the individual layer thickness of layer A and layer B is larger than 5 nm and smaller than 20 nm.

10. The coated cutting tool of claim 1, wherein the multilayer structure has a thickness of 1-20 μm.

11. The coated cutting tool of claim 1, wherein the coating is a PVD coating.

12. The coated cutting tool of claim 1, wherein the intermediate layer C has a thickness being between 50 and 150% of the individual layer thickness of layer B.

13. The coated cutting tool of claim 1, wherein the thickness of the intermediate layer C is at least 3 nm.

14. The coated cutting tool of claim 1, wherein the intermediate layer C consists of Ti1−yZryN, where y>0.

15. The coated cutting tool of claim 14, wherein 0<y<1.

16. Method of manufacturing a coated cutting tool comprising a substrate and a coating on the surface of the substrate, the method comprising the steps of:

depositing a multilayer structure consisting of alternating layers A and B forming the sequence A/B/A/B/A . . . with an individual layer thickness of layer A and layer B of 1-30 nm forming at least part of the coating, layer A consisting of Zr1−xAlxN, where 0<x<1, and layer B consisting of TiN; and heat treating the coating in an area being used in a cutting operation to form an intermediate layer C between said alternating layers A and B so as to form the sequence A/C/B/C/A/C/B . . . , layer C comprising one or more metal elements from each of said alternating layers A and B.

17. The method of claim 16, wherein the coating is heat treated at at least 1100° C. to form the intermediate layer C.

18. A coated cutting tool comprising a substrate and a coating on the substrate, wherein said coating comprises a multilayer structure, whereby said multilayer structure comprises:

alternating layers A and B; and in an area being used in a cutting operation the multilayer structure consists of alternating layers A and B and an intermediate layer C between said alternating layers A and B forming the sequence A/C/B/C/A/C/B . . . with an individual layer thickness of layer A and layer B of 1-30 nm, whereby layer A consists of $Zr_{1-x}Al_xN$, where $0<x<1$, and layer B consists of TiN and whereby layer C comprises one or more metal elements from each of layers A and B and is of different composition and structure than layers A and B.

19. The coated cutting tool of claim 18, wherein x is from 0.02 up to 0.35.

20. The coated cutting tool of claim 19, wherein x is from 0.10 up to 0.35.

21. The coated cutting tool of claim 18, wherein the $Zr_{1-x}Al_xN$ is cubic.

22. The coated cutting tool of claim 18, wherein x is from 0.35 up to 0.90.

23. The coated cutting tool of claim 22, wherein x is from 0.70 up to 0.90.

24. The coated cutting tool of claim 18, wherein layer A comprises a hexagonal phase of $Zr_{1-x}Al_xN$.

25. The coated cutting tool of claim 18, wherein the $Zr_{1-x}Al_xN$ is nanocrystalline with an average grain width of less than 10 nm.

26. The coated cutting tool of claim 18, wherein the individual layer thickness of layer A and layer B is larger than 5 nm and smaller than 20 nm.

27. The coated cutting tool of claim 18, wherein the multilayer structure has a thickness of 1-20 µm.

28. The coated cutting tool of claim 18, wherein the coating is a PVD coating.

29. The coated cutting tool of claim 18, wherein the intermediate layer C has a thickness being between 50 and 150% of the individual layer thickness of layer B.

30. The coated cutting tool of claim 18, wherein the thickness of the intermediate layer C is at least 3 nm.

31. The coated cutting tool of claim 18, wherein the intermediate layer C consists of $Ti_{1-y}Zr_yN$, where $y>0$.

32. The coated cutting tool of claim 31, wherein $0<y<1$.

33. The coated cutting tool of claim 27, wherein the multilayer structure has a thickness of 1-15 µm.

34. The coated cutting tool of claim 10, wherein the multilayer structure has a thickness of 1-15 µm.

* * * * *